(12) United States Patent
Ouyang et al.

(10) Patent No.: US 8,522,570 B2
(45) Date of Patent: Sep. 3, 2013

(54) INTEGRATED CIRCUIT CHIP COOLING USING MAGNETOHYDRODYNAMICS AND RECYCLED POWER

(75) Inventors: Chien Ouyang, Sunnyvale, CA (US); Kenny C. Gross, San Diego, CA (US); Ali Heydari, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1187 days.

(21) Appl. No.: 12/138,853

(22) Filed: Jun. 13, 2008

(65) Prior Publication Data
US 2009/0308081 A1    Dec. 17, 2009

(51) Int. Cl.
*F25D 23/12*    (2006.01)
(52) U.S. Cl.
USPC .............................. 62/259.2; 62/3.7; 165/287
(58) Field of Classification Search
USPC .................. 62/3.2, 3.3, 3.7, 259.2; 361/688; 136/203, 204; 165/288, 287, 297, 290; 700/295
See application file for complete search history.

(56) References Cited

U.S. PATENT DOCUMENTS

| 5,544,488 | A * | 8/1996 | Reid .................................. 62/3.7 |
| 5,921,087 | A * | 7/1999 | Bhatia et al. ...................... 62/3.2 |
| 6,620,994 | B2 * | 9/2003 | Rossi .............................. 136/201 |
| 6,708,501 | B1 * | 3/2004 | Ghoshal et al. .................... 62/3.7 |
| 6,799,282 | B2 * | 9/2004 | Maeda et al. .................. 713/500 |
| 6,880,345 | B1 * | 4/2005 | Leija et al. ........................ 62/3.2 |
| 7,131,286 | B2 * | 11/2006 | Ghoshal et al. .............. 62/259.2 |
| 7,284,379 | B2 * | 10/2007 | Pham et al. ....................... 62/3.3 |
| 7,313,921 | B2 * | 1/2008 | Milke-Rojo et al. ............. 62/3.7 |
| 7,508,671 | B2 * | 3/2009 | Sauciuc et al. ................ 361/700 |
| 7,812,245 | B2 * | 10/2010 | Reid .............................. 136/205 |
| 7,870,893 | B2 * | 1/2011 | Ouyang et al. ................ 165/288 |
| 2006/0137361 | A1 * | 6/2006 | Ghoshal ............................ 62/3.7 |
| 2010/0257871 | A1 * | 10/2010 | Venkatasubramanian et al. ............................... 62/3.7 |

\* cited by examiner

*Primary Examiner* — Marc Norman
*Assistant Examiner* — Devon Russell
(74) *Attorney, Agent, or Firm* — Park, Vaughan, Fleming & Dowler, LLP; Chia-Hsin Suen (57) ABSTRACT

Some embodiments of the present invention provide a system that cools an integrated circuit (IC) chip within a computer system. During operation, the system converts heat generated by a heat-generating device within the computer system during operation of the computer system into thermoelectric power. Next, the system supplies the thermoelectric power to drive a fluid pump. Finally, the system uses the fluid pump to conduct heat away from the IC chip.

16 Claims, 6 Drawing Sheets

INTEGRATED CIRCUIT CHIP COOLING USING MAGNETOHYDRODYNAMICS AND RECYCLED POWER

RELATED APPLICATION

The subject matter of this application is related to the subject matter in a co-pending non-provisional application by Chien Ouyang and Kenny C. Gross and filed on 21 Mar. 2007 entitled, "METHOD AND APPARATUS FOR COOLING INTEGRATED CIRCUIT CHIPS USING RECYCLED POWER," having Ser. No. 11/726,429.

BACKGROUND

1. Field of the Invention

The present invention relates to techniques for improving energy efficiency within computer systems. More specifically, the present invention relates to a method and system for cooling integrated circuit (IC) chips using magnetohydrodynamics and recycled power.

2. Related Art

Rapid advances in computing technology presently make it possible to perform trillions of operations each second on data sets as large as a trillion bytes. These advances can be largely attributed to an exponential increase in the density and complexity of integrated circuits (ICs). Unfortunately, in conjunction with this increase in computational power, power consumption and heat dissipation of ICs has also increased dramatically.

Specifically, high-end computer servers can easily generate 20 kilowatts or more heat. Consequently, some power-demanding system components, such as a CPU or a graphics processing unit (GPU), can quickly reach unsafe operating temperatures.

To maintain safe operating temperatures and to prevent overheating for critical system components, servers typically utilize a number of cooling techniques. One commonly used cooling technique includes affixing heat sinks to heat-generating components to thermally conduct heat from the components and using powerful fans to increase air circulation around these components and to pump heat out of the server.

Meanwhile, companies that operate servers are experiencing soaring energy costs because of the ever-increasing power consumption of the servers. Unfortunately, conventional cooling techniques require additional electrical power and therefore increase power consumption problems.

One way to reduce both power consumption and heat generation is to use low-power components. However, this approach may significantly restrict computational power and other aspects of server performance.

SUMMARY

Some embodiments of the present invention provide a system that cools an integrated circuit (IC) chip within a computer system. During operation, the system converts heat generated by a heat-generating device within the computer system during operation of the computer system into thermoelectric power. Next, the system supplies the thermoelectric power to drive a fluid pump. Finally, the system uses the fluid pump to conduct heat away from the IC chip.

In some embodiments, converting the heat generated by the heat-generating device into the thermoelectric power involves tapping into a temperature difference around the heat-generating device and converting the temperature difference into electricity using the Seebeck effect.

In some embodiments, tapping into the temperature difference around the heat-generating device involves tapping into a first temperature reference on the heat-generating device and tapping into a second temperature reference from a heat sink, which has a lower temperature than the heat-generating device.

In some embodiments, tapping into the temperature difference further involves using heat pipes to reduce the temperature of the second temperature reference and increasing the temperature difference using the reduced temperature of the second temperature reference.

In some embodiments, tapping into the first temperature reference involves coupling a first thermal interface of a thermoelectric module to the heat-generating device. In these embodiments, tapping into the second temperature reference involves coupling a second thermal interface of the thermoelectric module to the heat sink. Moreover, the temperature difference between the first thermal interface and the second thermal interface creates a voltage difference between the first and second thermal interfaces.

In some embodiments, the fluid pump is a magnetohydrodynamic (MHD) pump.

In some embodiments, conducting heat away from the IC chip involves using the fluid pump to pump conductive fluid containing heat from the IC chip to a heat dissipater and dissipating the heat using the heat dissipater.

In some embodiments, the heat dissipater can be a heat exchanger, a heat sink, a heat spreader, or a radiator.

In some embodiments, the system also converts heat generated by a number of heat-generating devices into thermoelectric power for each of the heat-generating devices and combines the thermoelectric power for each of the heat-generating devices into an aggregate thermoelectric power.

In some embodiments, the system also monitors the operating temperature of the IC chip using a continuous system telemetry harness (CSTH) and controls the flow rate of the fluid pump based on the monitored operating temperature by varying the number of heat-generating devices used to generate the thermoelectric power.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Embodiments of the present invention provide a method and system for cooling heat sources in computer systems. These heat sources may include central processing unit (CPU) chips, graphics processing unit (GPU) chips, power supplies, and/or hard disk drives (HDDs). More specifically, embodiments of the present invention provide a method and system for recycling the heat dissipated by electronic devices within a computer. To recycle the heat, the present invention couples a thermoelectric device directly to a heat-generating device so that the thermoelectric device can convert the temperature difference into thermoelectric power using the Seebeck effect. Heat-generating devices may include microprocessor chip packages, GPU chip packages, application-specific integrated circuit (ASIC) chip packages, video processor chip packages, digital signal processor (DSP) chip packages, memory chip packages, power supplies, graphics cards, HDDs, and/or motherboards.

The thermoelectric power may then be supplied to other parts of the computer system to reduce the operating temperature of other heat-generating components. In particular, the thermoelectric power may be used to drive a fluid pump that conducts heat away from an integrated circuit (IC) chip. The heat may be conducted by a cooling fluid that is carried away from thermal contact with the IC chip to a heat dissipater such as a heat exchanger, heat sink, heat spreader, and/or radiator. Once the heat is transferred from the cooling fluid to the heat dissipater, the cooling fluid may be routed back to the IC chip for dissipation of additional heat generated by the IC chip. Consequently, some of the "waste energy" within a computer system is recycled and reused; moreover, power dedicated toward conventional cooling methods may be reduced.

Figure 1:
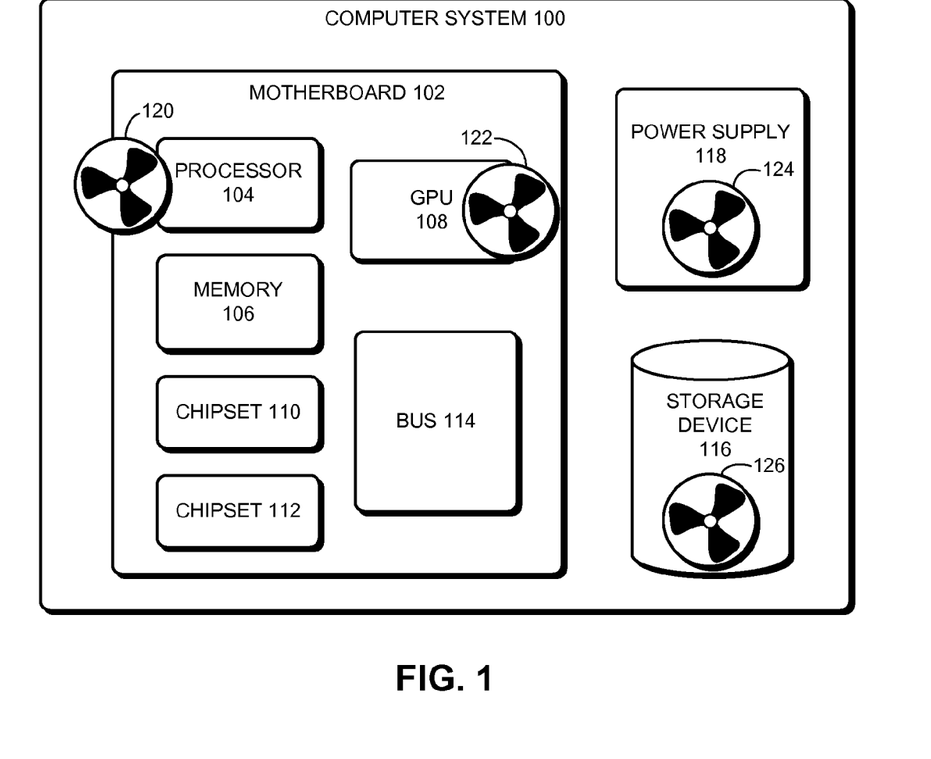
FIG. 1 provides a block diagram illustrating a computing system in accordance with an embodiment of the present invention.

FIG. 1 provides a block diagram illustrating a computing system 100 in accordance with an embodiment of the present invention. Computing system 100 includes a motherboard 102. Motherboard 102 includes a number of IC chips, such as a processor 104 and a memory chip 106. Processor 104 can include any type of processor, including, but not limited to, a microprocessor (CPU), a digital signal processor, a device controller, or a computational engine within an appliance.

Motherboard 102 additionally includes a graphics processing unit (GPU) 108 and a number of chipsets 110-112. In one embodiment of the present invention, chipsets 110 and 112 include a northbridge chip and a southbridge chip, respectively. Motherboard 102 also includes a peripheral bus 114, which couples processor 104, memory 106, GPU 108, and chipsets 110-112 with peripheral devices, such as a storage device 116. Note that GPU 108 can alternatively be integrated onto a video card that communicates with motherboard 102 through peripheral bus 114.

Storage device 116 may correspond to any type of non-volatile storage device that can be coupled to a computer system. This includes, but is not limited to, magnetic, optical, and magneto-optical storage devices, as well as storage devices based on flash memory and/or battery-backed up memory.

Computer system 100 also includes a power supply 118 that provides electrical power in a form that is suitable for driving components on motherboard 102 and peripherals such as storage device 116.

Note that each component described above may dissipate a great amount of heat during normal operation. In particular, processor 104, GPU 108, storage device 116, and power supply 118 may dissipate more heat than other system components, and therefore are often air cooled with dedicated fans 120-126.

Note that although the present invention is described in the context of computer system 100 illustrated in FIG. 1, the present invention can generally operate on any type of electronics that requires cooling during operation. Hence, the present invention is not limited to the computer system 100 illustrated in FIG. 1.

The Peltier effect and the Seebeck effect are collectively referred to as the "thermoelectric effect," wherein the Peltier effect and the Seebeck effect are reversals of each other. More specifically, the Peltier effect converts electrical power into a temperature difference while the Seebeck effect converts thermal (i.e. temperature) gradients into electric power, such a voltage or a current.

The Seebeck effect produces an electromotive force (EMF) and consequently a voltage in the presence of a temperature difference between two dissimilar conductors, such as metals or semiconductors. When the two conductors are connected in a complete loop, the EMF causes a continuous current to flow in the conductors. Hence, the Seebeck effect effectively converts thermal energy into a thermoelectric power. The voltage created is typically of the order of several microvolts per degree difference.

Figure 2A:
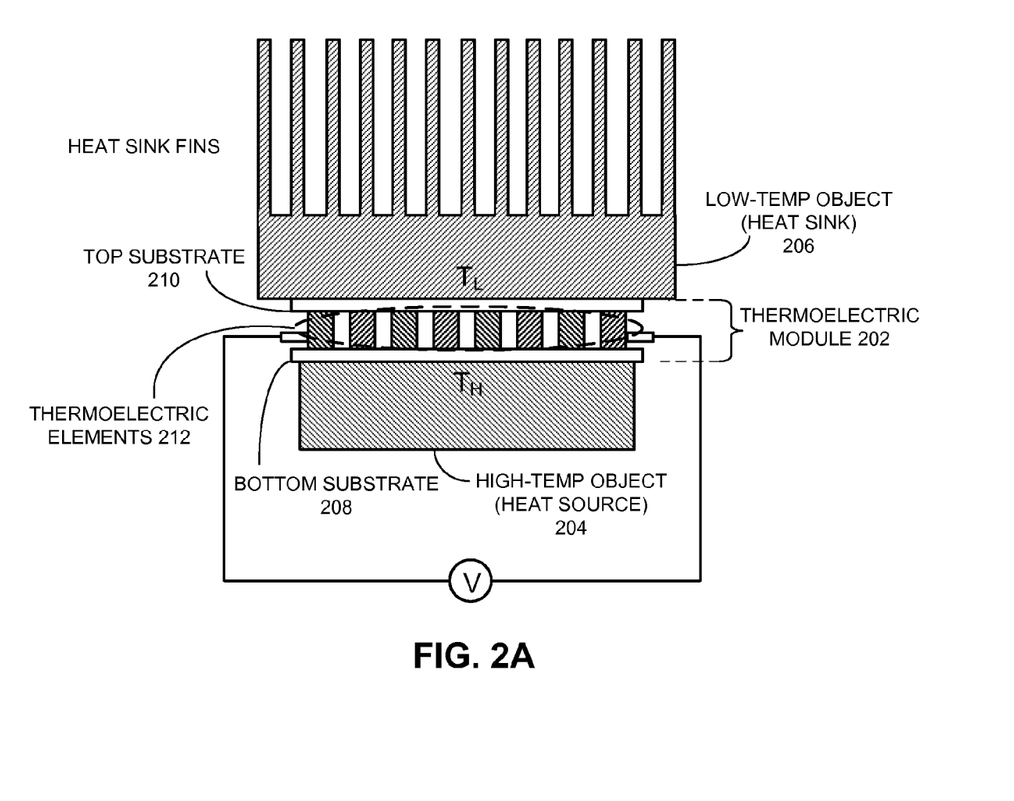
FIG. 2A illustrates an exemplary configuration for converting a temperature difference into thermoelectric power in accordance with an embodiment of the present invention.

One embodiment of the present invention utilizes the Seebeck effect to convert temperature differences within a computer system into thermoelectric power in the form of a voltage or a current. FIG. 2A illustrates an exemplary configuration for converting a temperature difference into thermoelectric power in accordance with an embodiment of the present invention. As shown in FIG. 2A, a thermoelectric module 202 is sandwiched between a high-temperature object 204 and a low-temperature object 206. More specifically, thermoelectric module 202 comprises a bottom substrate 208 that is in thermal contact with high-temperature object 204 at a temperature $T_H$, and a top substrate 210 that is in thermal contact with low-temperature object 206 at a temperature $T_L$. Thermoelectric module 202 also includes a series of thermoelectric elements 212 which are disposed between substrate 208 and 210 in a manner that facilitates the generation of thermoelectric power. In one embodiment, thermoelectric elements 212 are made of semiconductor thermoelectric materials. These thermoelectric elements are described in further detail below.

In one embodiment of the present invention, high-temperature object 204 is a heat-generating component/device within a computer system. Such heat-generating components/devices can include, but are not limited to: a microprocessor chip package, a graphics processor chip package, an ASIC chip package, a video processor chip package, a DSP chip package, a memory chip package, a power supply, a graphics card, a HDD, a motherboard, and/or any other heat-generating devices within the computer system. Note that bottom substrate 208 of thermoelectric module 202 obtains the high temperature reference $T_H$ from the top surface of heat source 204.

In one embodiment of the present invention, low-temperature object 206 is a heat sink, or in other words, a machined metal device with a base for thermal contact and a group of heat sink fins for heat dissipation. The high thermal conductivity of the metal combined with its large surface area cause a rapid transfer of thermal energy to the surrounding environment, which facilitates maintaining a low temperature in the heat sink. Hence, the top substrate 210 of thermoelectric module 202 obtains a low temperature reference $T_L$ from the bottom surface of heat sink 206.

Thermoelectric module 202 taps into the temperature difference between the low temperature reference and the high temperature reference (i.e., $T_H-T_L$) and continuously generates a thermoelectric power from the temperature difference. While doing so, the system effectively "recycles" heat dissipated by heat source 204 into potentially useful electricity. Referring to FIG. 2A, note that no external power is needed to perform such thermoelectric energy conversion.

In addition, more thermoelectric power may be obtained from heat source 204 by increasing the temperature difference $T_H-T_L$. This also allows more waste energy to be recycled. In one embodiment of the present invention, the temperature difference is increased by decreasing $T_L$. For example, $T_L$ may be reduced by using a heat sink fan, which may require additional power.

Temperature $T_L$ may also be reduced using heat pipes. In particular, heat pipes may employ an evaporative cooling mechanism to transfer thermal energy from one end of a pipe to another by the evaporation and condensation of a working fluid or coolant.

More specifically, a single heat pipe includes a vacuum tight container, a capillary wick structure and a working fluid. Typically, the heat pipe is evacuated and then back-filled with a small quantity of a working fluid, just enough to saturate the wick. The atmosphere inside the heat pipe is set by an equilibrium condition of liquid and vapor. As heat enters the heat pipe from one end (the evaporating end), this equilibrium condition is disrupted, and some working fluid evaporates, which increases the vapor pressure at this end of the pipe. This higher-pressure vapor travels to the condensing end of the pipe where the slightly lower temperature causes the vapor to condense, and thereby releases its latent heat absorbed during vaporization. The condensed fluid is then pumped back to the evaporating end by the capillary forces developed in the wick structure.

This continuous cycle can transfer large quantities of heat with very low thermal gradients. Note that the heat pipe operation is passive so that the only driving force of the heat-transfer process is the heat that is being transferred.

Figure 2B:
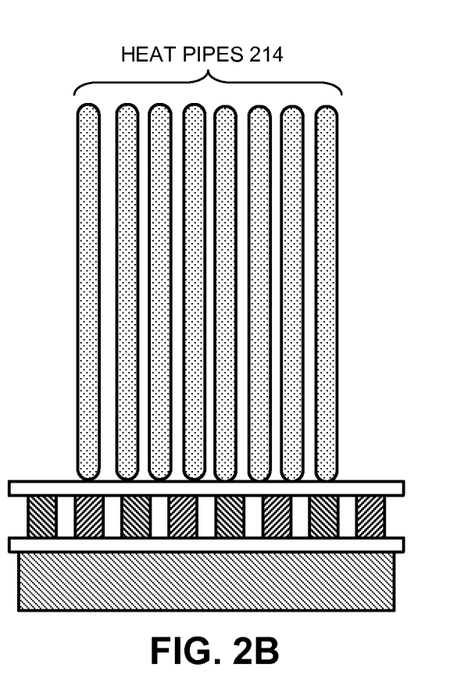
FIG. 2B illustrates the use of heat pipes to achieve a low temperature reference for thermoelectric power generation in accordance with an embodiment of the present invention.

FIG. 2B illustrates the use of heat pipes to achieve a low temperature reference for thermoelectric power generation in accordance with an embodiment of the present invention. In this embodiment, a set of heat pipes 214 may be used in lieu of heat sink 206 in FIG. 2A. Note that the evaporating ends of heat pipes 214 are in direct contact with top substrate 210 and therefore continuously absorb and transfer heat away to maintain a low $T_L$ at substrate 210.

Figure 2C:
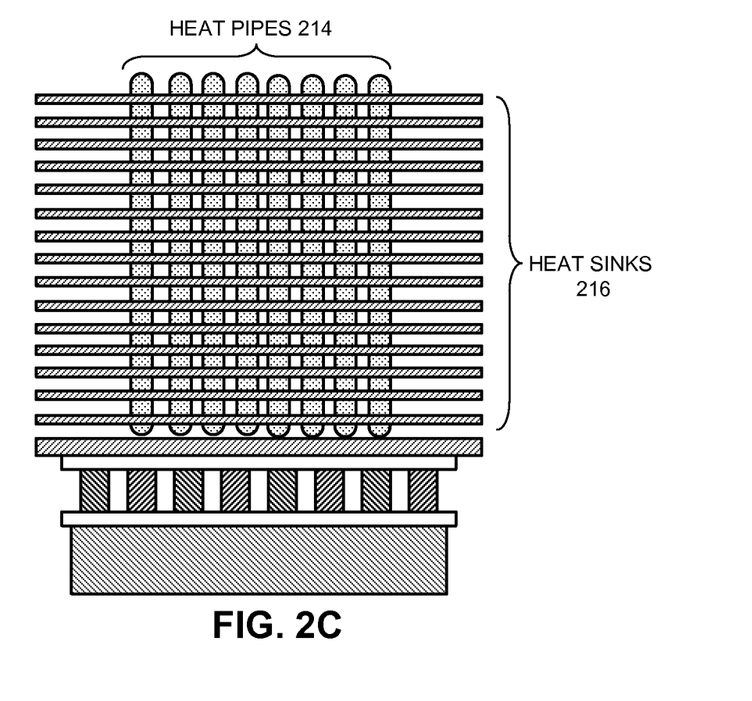
FIG. 2C illustrates the use of heat pipes integrated with a heat sink to achieve the low temperature reference in accordance with an embodiment of the present invention.

FIG. 2C illustrates using heat pipes integrated with a heat sink to achieve a low temperature reference for the thermoelectric power generation in accordance with an embodiment of the present invention. Note that integrated heat pipes 214 and heat sink 216 take advantage of both the heat transfer ability of the heat pipes and the large heat dissipation surface area of the heat sink, which further increases the system's ability to achieve a lower $T_L$ at substrate 210.

Note that although we describe using a heat sink or heat pipes to obtain a low temperature reference, other techniques may also be used to achieve a low temperature reference. Furthermore, configurations in FIGS. 2A-2C are intended for illustrative purposes and therefore should not limit other possible configurations which can convert waste heat generated by heat-dissipation devices into thermoelectric power.

Note that the above-described technique can be simultaneously employed by multiple heat-generating devices. Thus, multiple heat sources 204 can include a subset of the following: the CPU, the GPU, the memory chips, the chipsets, the HHD, and the power supply. Because the sizes and temperatures of these devices can be quite different, the amount of thermoelectric power generated from each of these heat-generating devices can vary widely. However, the thermoelectric power from each of these devices can be combined into an aggregated power, for example, by merging a number of tributary thermoelectric currents into an aggregate current.

This thermoelectric power may then be supplied to other devices in the same computer system. For example, it can be used to drive a low power chip. In one embodiment of the present invention, this thermoelectric power is used to drive a cooling device within the same computer system. In one embodiment of the present invention, the cooling device corresponds to a fluid pump that circulates cooling fluid to and from a heat source to dissipate heat from the heat source.

Figure 3A:
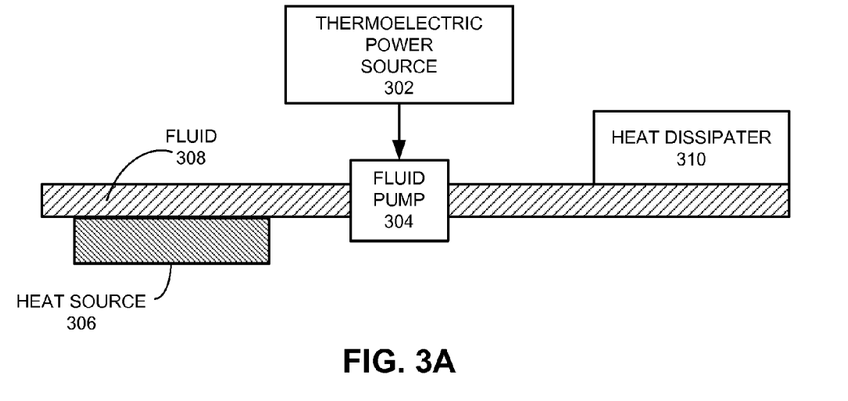
FIG. 3A shows a cooling system in accordance with an embodiment of the present invention.

FIG. 3A shows a cooling system in accordance with one embodiment of the present invention. As shown in FIG. 3A, this thermoelectric power from a thermoelectric power source 302 is used to drive a fluid pump 304 that is used to conduct heat away from a heat source 306 (e.g., an IC chip). Note that thermoelectric power source 302 may include a DC voltage source or an equivalent DC current source.

To conduct heat away from heat source 306, fluid pump 304 may pump fluid 308 that is in thermal contact with heat source 306 away from heat source 306 using one or more pipes, channels, and/or microchannels containing the fluid, such as heat pipes. In one embodiment of the present invention, fluid pump 304 corresponds to a magnetohydrodynamic (MHD) pump. Furthermore, fluid 308 may correspond to conductive fluid whose flow through the pipe(s) is controlled by the MHD pump, such as a ferrofluid, liquid metal, indium gallium slurry, and/or salt water. In other words, fluid pump 304 may include a magnet and a set of electrodes that are powered by thermoelectric power source 302. The current and/or amplitude of each electrode may be varied to drive the pump and direct the flow of the conductive fluid within the pipe(s), channels, and/or microchannels.

As fluid 308 comes into thermal contact with heat source 306, fluid 308 absorbs some of the heat and is carried away from heat source 306 by fluid pump 304 to heat dissipater 310. Heat dissipater 310 may then be used to accelerate the dissipation of heat from the fluid. In other words, heat dissipater 310 may correspond to a device, such as a heat exchanger, heat sink, heat spreader, and/or radiator, which facilitates the transfer of heat from fluid 308 to the surrounding environment. Fluid that is cooled by heat dissipater 310 may be circulated back to heat source 306 to conduct additional heat away from heat source 306. Alternatively, fluid 308 may be cooled by simply removing fluid 308 from thermal contact with heat source 306 and allowing the heat to dissipate from fluid 308 into the cooler surrounding environment.

Those skilled in the art will appreciate that heat source 306 may be cooled using a variety of pump-based mechanisms. In particular, fluid pump 304 may correspond to a variety of mechanical and non-mechanical pumps for circulating cooling fluid 308 through one or more pipes and/or channels in thermal contact with heat source 306. For example, fluid pump 304 may be a centrifugal pump, positive displacement pump, electrohydrodynamic pump, piezoelectric pump, and/or electrokinetic pump. Similarly, different fluids may be used to conduct heat away from heat source 306. For example, an electrokinetic pump may utilize an ionic fluid, while a magnetohydrodynamic pump may utilize a liquid metal.

Figure 3B:
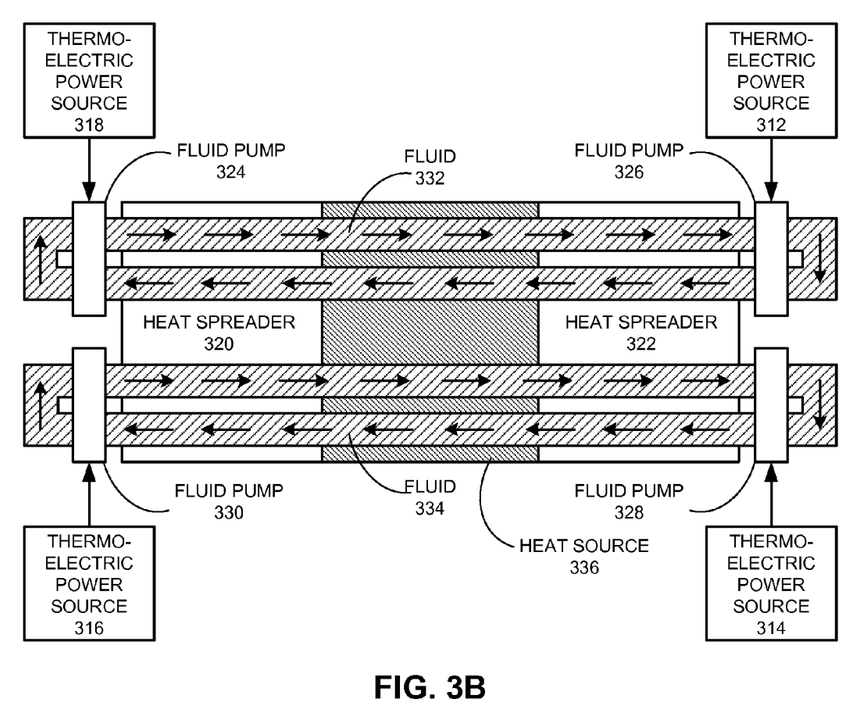
FIG. 3B shows a cooling system in accordance with an embodiment of the present invention.

FIG. 3B shows a cooling system in accordance with an embodiment of the present invention. More specifically, FIG. 3B shows a cooling system that utilizes a number of thermoelectric power sources 312-318 to drive fluid pumps 324-330 that dissipate heat from a heat source 336. Fluid pumps 324-330 are used to pump fluid 332-334 in a clockwise direction around heat source 336 and two heat spreaders 320-322. While in thermal contact with heat source 336, fluid 332-334 absorbs heat from heat source 336. As the heated fluid is carried away from heat source 336 using fluid pumps 324-330, the heat is transferred to heat spreaders 320-322 on either side of heat source 336.

As shown in FIG. 3B, each fluid pump 324-330 is powered by a thermoelectric power source 312-318. In other words, each fluid pump 324-330 may be associated with a heat-generating device within a computer system, such as a microprocessor chip package, a graphics processor chip package, an ASIC chip package, a video processor chip package, a DSP chip package, a memory chip package, a power supply, a graphics card, an HDD, and/or a motherboard. Similarly, heat source 336 may correspond to an IC chip, such as a microprocessor chip, a graphics processor chip, an application-specific integrated circuit (ASIC) chip, a video processor chip, a digital signal processor (DSP) chip, and/or a memory chip.

Those skilled in the art will appreciate that the number and arrangement of fluid pumps, thermoelectric power sources, and/or heat spreaders (or other heat dissipaters) may be varied for the purposes of dissipating heat from heat source 336. For example, one or more fluid pumps may be used to route cooling fluid through a variety of pipes, tubes, channels, and/or microchannels. Each fluid pump may be powered by one or more thermoelectric power sources. Finally, heat from heat source 336 may be dissipated using the pipes, tubes, and/or channels through which the fluid is pumped, or additionally from one or more heat spreaders, heat exchangers, heat sinks, and/or other heat dissipaters.

One embodiment of the present invention uses a fluid pump to cool "hot spots" within an IC chip. Note that heat generation and hence temperature distribution within a chip package is typically not uniform. Depending on a specific chip design, some small regions/spots within a chip can have significantly higher temperatures than an average chip temperature. These "hot spots" show up as peaks within a chip temperature profile as a function of chip dimensions, and can severely deteriorate the chip performance and reduce lifetime. On the other hand, reducing the hot spot temperature a few degrees can reduce thermal stress and can thereby enhance long-term reliability.

Note that cooling these hot spots typically requires less power than cooling an entire chip. As such, power may be conserved by using thermoelectric power to circulate cooling fluid in the vicinity of the hot spots in lieu of increasing the utilization of other cooling devices, such as fans or air conditioning.

Figure 4:
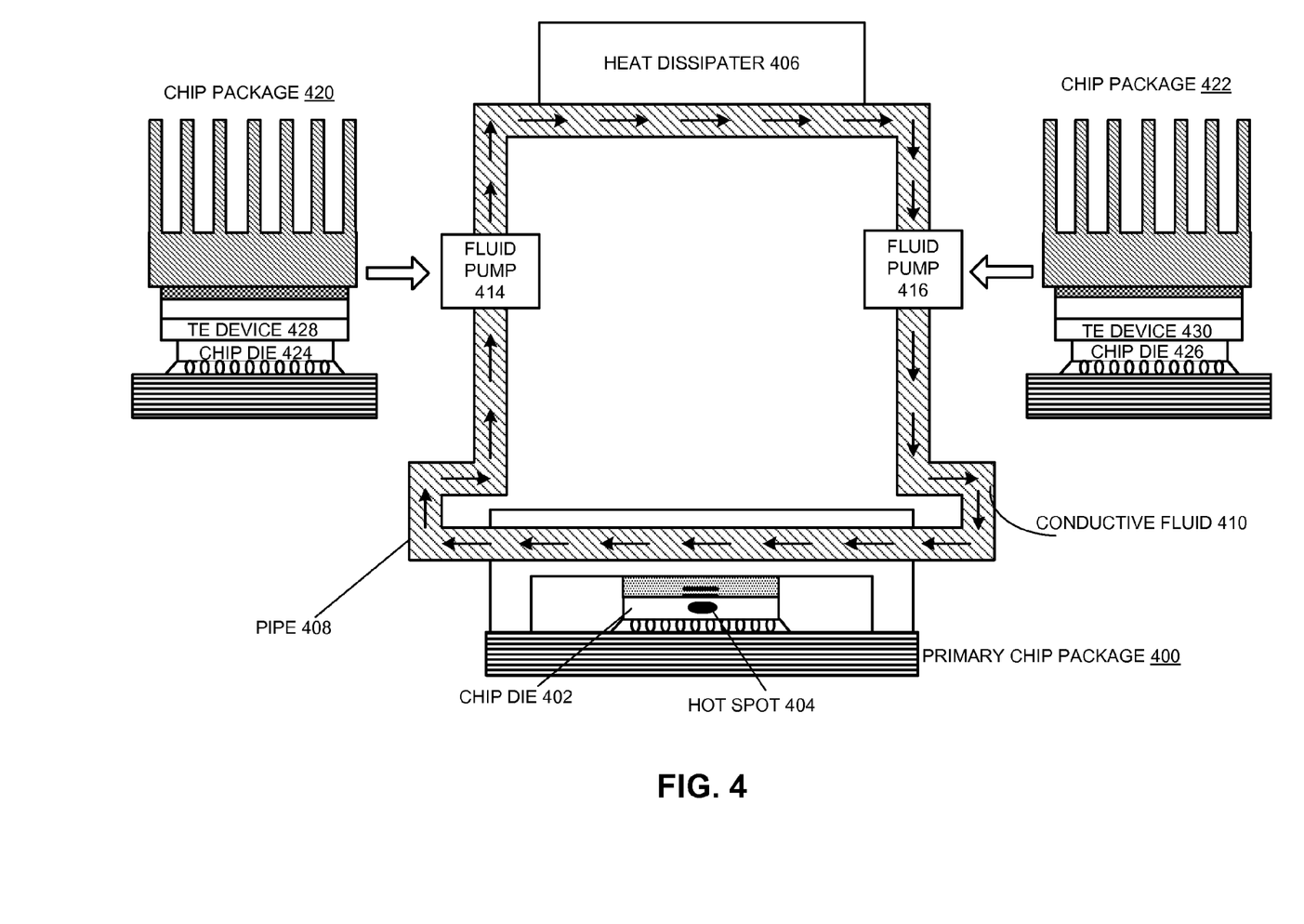
FIG. 4 shows a cross-sectional view of a system for cooling hot spots within an IC chip in accordance with an embodiment of the present invention.

FIG. 4 shows a cross-sectional view of a system for cooling hot spots within an IC chip in accordance with an embodiment of the present invention. As shown in FIG. 4, a primary chip package 400 comprises a chip die 402 which produces a hot spot 404 during operation. Hot spot 404 may correspond to a targeted heat source that requires cooling. Note that primary chip package 400 can include, but is not limited to a microprocessor chip (CPU) package, a graphics processor chip (GPU) package, an ASIC chip package, a video processor chip package, a DSP chip package, and a memory chip package. In a further embodiment, primary chip package 400 is a chip package in a system that demands significantly higher operating power than most other chips in the system.

To cool hot spot 404, conductive fluid 410 is routed directly over hot spot 404 using a pipe 408. Alternatively, a network of channels and/or microchannels may be used to place conductive fluid 410 in thermal contact with hot spot 404. To cool hot spot 404, two fluid pumps 414-416 may be used to pump conductive fluid 410 in a clockwise direction from hot spot 404 to a heat dissipater 406. As described above, heat dissipater 406 may correspond to a heat spreader, heat exchanger, heat sink, and/or radiator. Once heat is transferred from conductive fluid 410 to heat dissipater 406, conductive fluid 410 is pumped back to primary chip package 400 to absorb additional heat from hot spot 404. Furthermore, if chip die 402 produces multiple hot spots, one or more pipes, channels, and/or microchannels may be positioned directly above the hot spots to provide focused cooling for each hot spot.

In one embodiment of the present invention, electrical power for fluid pumps 414-416 is provided by power-generator chip packages 420 and 422, which are configured to convert their own dissipated heat into thermoelectric power. More specifically, chip packages 420-422 include chip dies 424-426, which are thermally coupled to bulk (chip-size) thermoelectric devices 428-430, respectively. Thermoelectric devices 428-430 may be used to transform thermal energy (that would otherwise be waste heat) generated by chip dies 424-426 into thermoelectric power, which may then be supplied to fluid pumps 414-416 to conduct heat away from hot spot 404 by circulating conductive fluid 410 between hot spot 404 and heat dissipater 406. As mentioned previously, other non-chip heat-generating devices, such as an HDD or a video card may also be used to generate the thermoelectric cooling power. Furthermore, the number of power-generator chip packages and/or fluid pumps used to dissipate heat from chip die 402 may be greater or less than two.

Figure 5:
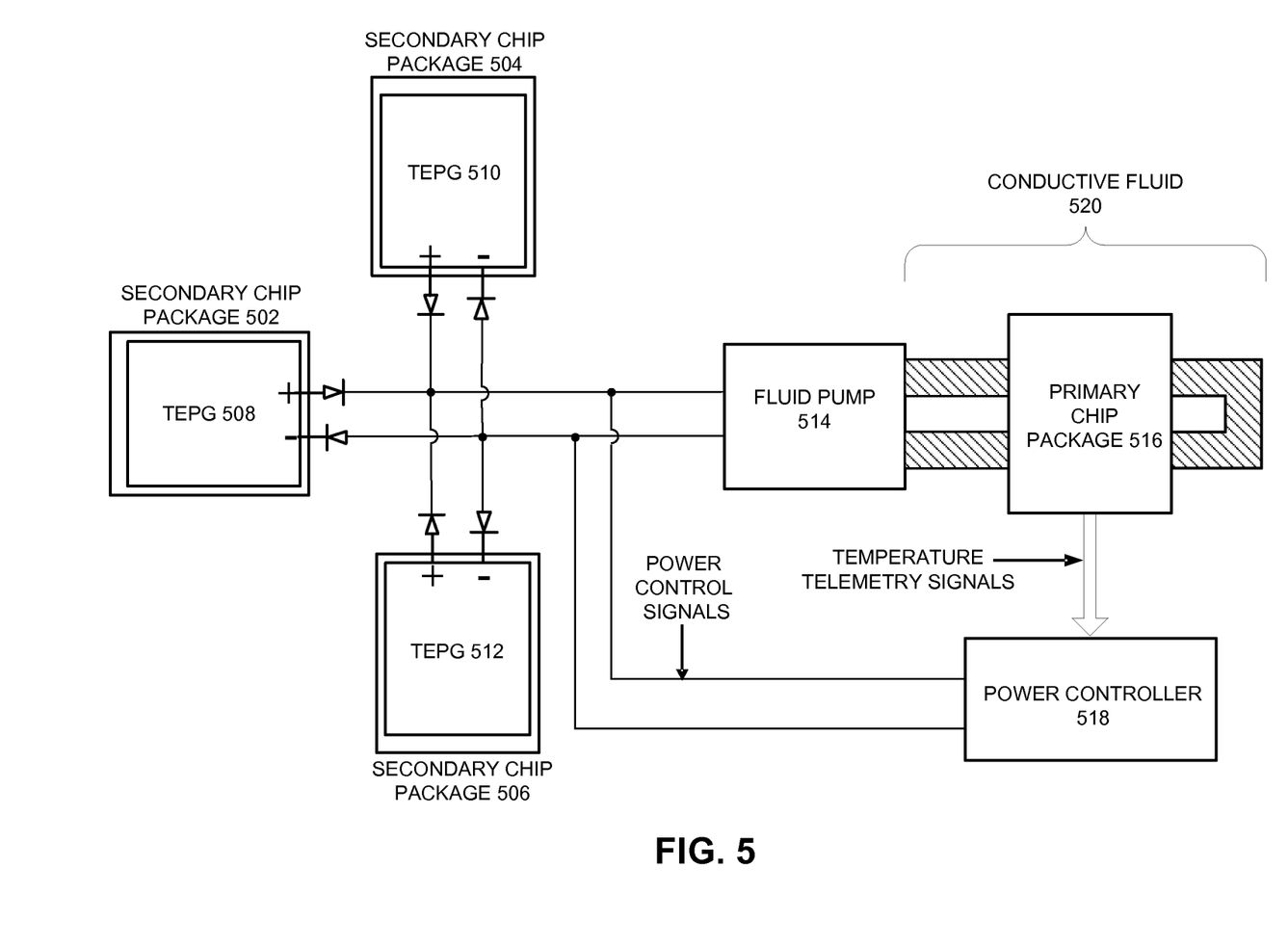
FIG. 5 illustrates the process of provisioning thermoelectric power for cooling a primary chip package in accordance with an embodiment of the present invention.

FIG. 5 illustrates the process of provisioning thermoelectric power for cooling a primary chip package in accordance with an embodiment of the present invention. As seen in FIG.

5, a number of secondary chip packages 502-506 are configured to operate as thermoelectric power generators (TEPGs) 508-512. In one embodiment, chip packages 502-506 are coupled to "bulk" thermoelectric modules to form bulk TEPGs 508-512, respectively. These bulk TEPGs are capable of converting the heat dissipated from chip packages into electrical power within each of the TEPGs. TEPGs 508-512 are coupled to a fluid pump 514 that is used to circulate conductive fluid 520 and conduct heat away from a primary chip package 516. In one embodiment, conductive fluid 520 is routed through one or more pipes to cool one or more hot spots within primary chip package 516.

In one embodiment of the present invention, the operating temperatures, including an average chip temperature and hot spot temperatures of primary chip package 516, are monitored through one or more sensors. In one embodiment, these sensors are integrated into a Continuous System Telemetry Harness (CSTH) that provides continuous digitized temperature and wattage feedback from the chip package to a power controller 518. In one embodiment, if the monitored temperature is above a threshold temperature, power controller 518 may determine that the power supplied to fluid pump 514 is not sufficient and subsequently provision supplementary power to fluid pump 514. To provide the supplementary power, an additional TEPG (e.g., TEPG 508-512) may be introduced into the power supply path. The increased power may then be used to increase the flow rate of fluid pump 514.

On the other hand, if the monitored temperature is below a low threshold, power controller 518 may determine that the power supplied to fluid pump 514 is more than sufficient and adjust the thermoelectric power to fluid pump 514 by reducing a TEPG from the power supply path. The reduction in thermoelectric power to fluid pump 514 may result in a decrease in the flow rate of fluid pump 514. Furthermore, the thermoelectric power from the omitted TEPG may be diverted to cool other primary chip packages. Power controller 518 may directly measure an aggregated current input into fluid pump 514 and determine if a sufficient cooling power is achieved. In addition, if fluid pump 514 corresponds to an MHD pump and/or other pump that utilizes electrodes, power controller 518 may supply thermoelectric power in varying quantities to each of the electrodes to manipulate the flow of conductive fluid 520 toward and away from primary chip package 516.

One embodiment of the present invention provides a mechanism to regulate the flow of electric current. Because multiple TEPGs may simultaneously provide power to a single fluid pump 514, diodes may be used to control current flow directions to prevent any conflict of current flows between these TEPGs. These diode placements are shown in FIG. 5. Note that they are arranged to regulate multiple supply currents so that the currents flow in the same direction to always add up. Consequently, each TEPG contributes its own power to fluid pump 514 without conflicting with other TEPGs.

The present invention provides a technique to recycle waste thermal energy dissipated by electronic components within a computer system by converting the "waste heat" into useful thermoelectric power using thermoelectric devices. In particular, heat pipes can be used to create greater temperature difference around the thermoelectric devices, thereby achieving greater thermoelectric-conversion efficiency.

This thermoelectric power can then be supplied to other system components, thereby reducing overall system power requirements and saving energy. In particular, this thermoelectric power can be used to drive one or more fluid pumps that are used to conduct heat away from IC chips. A CSTH feedback control mechanism can be used to adjust the flow rate of the cooling pumps by controlling the number of thermoelectric power generators used to power the fluid pump(s).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for cooling an integrated circuit (IC) chip within a computer system, comprising:
    converting heat generated by one or more heat-generating devices within the computer system during operation of the computer system into thermoelectric power from each of the heat-generating devices;
    combining the thermoelectric power from each of the heat-generating devices into an aggregate thermoelectric power;
    supplying the aggregate thermoelectric power to drive a fluid pump;
    using the fluid pump to conduct heat away from the IC chip;
    monitoring the operating temperature of the IC chip using a continuous system telemetry harness (CSTH); and
    controlling the flow rate of the fluid pump based on the monitored operating temperature by varying the number of heat-generating devices used to generate the aggregate thermoelectric power that drives the fluid pump.

2. The method of claim 1, wherein converting the heat generated by the one or more heat-generating devices into thermoelectric power involves:
    tapping into a temperature difference around each heat-generating device; and
    converting the temperature difference into electricity using the Seebeck effect.

3. The method of claim 2, wherein tapping into the temperature difference around each heat-generating device involves:
    tapping into a first temperature reference on the heat-generating device; and
    tapping into a second temperature reference from a corresponding heat sink, which has a lower temperature than the heat-generating device.

4. The method of claim 3, wherein tapping into the temperature difference further involves:
    using heat pipes to reduce the temperature of the second temperature reference; and
    increasing the temperature difference using the reduced temperature of the second temperature reference.

5. The method of claim 3,
    wherein tapping into the first temperature reference involves coupling a first thermal interface of a thermoelectric module to the corresponding heat-generating device;
    wherein tapping into the second temperature reference involves coupling a second thermal interface of the thermoelectric module to the corresponding heat sink; and
    wherein the temperature difference between the first thermal interface and the second thermal interface creates a voltage difference between the first and second thermal interfaces.

6. The method of claim 1, wherein the fluid pump comprises a magnetohydrodynamic (MHD) pump.

7. The method of claim 6, wherein conducting heat away from the IC chip involves:
- using the fluid pump to pump conductive fluid containing heat from the IC chip to a heat dissipater; and
- dissipating the heat using the heat dissipater.

8. The method of claim 7, wherein the heat dissipater is at least one of a heat exchanger, a heat sink, a heat spreader, and a radiator.

9. A system for cooling an integrated circuit (IC) chip within a computer system, comprising:
- an energy-conversion mechanism configured to convert heat generated by one or more heat-generating devices within the computer system during operation of the computer system into thermoelectric power from each of the heat-generating devices; and;
- a combining mechanism configured to combine the thermoelectric power from each of the heat-generating devices into an aggregate thermoelectric power;
- a fluid pump configured to conduct heat away from the IC chip using the aggregate thermoelectric power;
- a monitoring mechanism configured to monitor the operating temperature of the IC chip using a CSTH; and
- a controlling mechanism configured to vary a flow rate of the fluid pump based on the monitored operating temperature by varying the number of heat-generating devices used to generate the aggregate thermoelectric power that is used to power the fluid pump.

10. The system of claim 9, wherein the energy-conversion mechanism is further configured to:
- tap into a temperature difference around each heat-generating device; and
- convert the temperature difference into electricity using the Seebeck effect.

11. The system of claim 10, further comprising:
- corresponding heat sink in thermal contact with each heat-generating device,
- wherein, while tapping into the temperature difference around each heat-generating device, the energy-conversion mechanism is further configured to:
  - tap into a first temperature reference on each heat-generating device; and
  - tap into a second temperature reference from the corresponding heat sink, which has a lower temperature than the heat-generating device.

12. The system of claim 11, further comprising:
- a set of heat pipes configured to reduce the temperature of the second temperature reference,
- wherein the energy-conversion mechanism is further configured to increase the temperature difference using the reduced temperature of the second temperature reference.

13. The system of claim 11,
- wherein tapping into the first temperature reference involves coupling a first thermal interface of a thermoelectric module to a corresponding heat-generating device;
- wherein tapping into the second temperature reference involves coupling a second thermal interface of the thermoelectric module to a corresponding heat sink; and
- wherein the temperature difference between the first thermal interface and the second thermal interface creates a voltage difference between the first and second thermal interfaces.

14. The system of claim 9, wherein the fluid pump comprises a magnetohydrodynamic (MHD) pump.

15. The system of claim 14, wherein the fluid pump conducts heat away from the IC chip by:
- pumping conductive fluid containing heat from the IC chip inside a heat transfer pipe to a heat dissipater; and
- dissipating the heat using the heat dissipater.

16. The system of claim 15, wherein the heat dissipater is at least one of a heat exchanger, a heat sink, a heat spreader, and a radiator.

\* \* \* \* \*